United States Patent
Lee et al.

(10) Patent No.: US 7,554,353 B2
(45) Date of Patent: Jun. 30, 2009

(54) METHOD OF CONTROLLING ON-DIE TERMINATION OF MEMORY DEVICES SHARING SIGNAL LINES

(75) Inventors: Dong-woo Lee, Suwon-si (KR); Jung-yong Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1 day.

(21) Appl. No.: 11/723,518

(22) Filed: Mar. 20, 2007

(65) Prior Publication Data

US 2008/0030221 A1 Feb. 7, 2008

(30) Foreign Application Priority Data

Jun. 16, 2006 (KR) .................... 10-2006-0054370

(51) Int. Cl.
*H03K 17/16* (2006.01)
*G11C 7/00* (2006.01)

(52) U.S. Cl. .................. 326/30; 326/86; 365/200; 365/222; 365/63; 365/189.05

(58) Field of Classification Search .................. 326/30, 326/21, 26, 27; 327/108; 365/200, 222, 365/63, 189.05
See application file for complete search history.

(56) References Cited

U.S. PATENT DOCUMENTS

| | | | |
|---|---|---|---|
| 6,894,946 B2 * | 5/2005 | Jang | 365/233.1 |
| 6,930,904 B2 * | 8/2005 | Wu | 365/72 |
| 7,180,327 B2 * | 2/2007 | So et al. | 326/30 |
| 7,259,585 B2 * | 8/2007 | Brinkman et al. | 326/30 |
| 7,274,583 B2 * | 9/2007 | Park et al. | 365/63 |
| 7,388,805 B2 * | 6/2008 | Lee et al. | 365/233.1 |
| 2005/0212551 A1 * | 9/2005 | So et al. | 326/30 |
| 2008/0197877 A1 * | 8/2008 | Cox et al. | 326/38 |

FOREIGN PATENT DOCUMENTS

| | | | |
|---|---|---|---|
| KR | 1020050001167 A | 1/2005 |
| KR | 1020050049236 A | 5/2005 |
| KR | 1020050104236 A | 11/2005 |

* cited by examiner

*Primary Examiner*—Vibol Tan
(74) *Attorney, Agent, or Firm*—Volentine & Whitt, P.L.L.C.

(57) ABSTRACT

A method of controlling On-Die Termination (ODT) resistors of memory devices sharing signal lines is provided. The ODT controlling method comprises setting an ODT control enable signal of each of the memory devices and address/command or data termination information to a mode register of the corresponding memory device, and controlling resistances of ODT resistors of the signal lines in the memory devices in response to the address/command or data termination information and termination addresses. When only one of the memory devices is activated, ODT resistors of the activated memory device are set to a first resistance. When all the memory devices are activated, ODT resistors of the memory devices are set to a second resistance.

14 Claims, 7 Drawing Sheets

FIG. 4

| TERM. ADDRESS | TERM. RESISTOR VALUE [Ω] |
|---|---|
| TA0 | 60(DEFAULT) |
| TA1 | 120 |
| TA2 | 240 |
| TA3 | RESERVED |

US 7,554,353 B2

METHOD OF CONTROLLING ON-DIE TERMINATION OF MEMORY DEVICES SHARING SIGNAL LINES

BACKGROUND OF THE INVENTION

1. Field of the Invention

The present invention relates to semiconductor devices and systems incorporating same. More particularly, the invention relates to a method of controlling on-die terminations for semiconductor memory devices sharing one or more transmission line (e.g., address lines, command lines, and/or data lines).

This application claims the benefit of Korean Patent Application No. 10-2006-0054370, filed on Jun. 16, 2006, the subject matter of which is hereby incorporated by reference.

2. Description of the Related Art

Within semiconductor systems, it is generally necessary to match the impedance of a transmission line with a corresponding termination impedance (e.g., a resistor) in order to prevent undesirable signal reflections. Such signal reflections act as noise on the signal line in relation to signals subsequently transmitted on the transmission line.

Figure (FIG.) 1 is a block diagram of a conventional semiconductor system. Referring to FIG. 1, a controller 100 is connected to first and second memory devices 200 and 300, which are assumed to be DRAMs for purposes of illustration. Controller 100 outputs a clock signal CLK, first and second chip select signals CS0 and CS1, a command signal CMD, a data input/output signal DQ, and a data strobe signal DQS. First DRAM 200 receives the clock signal CLK, the first chip select signal CS0, the command signal CMD, the data input/output signal DQ, and the data strobe signal DQS. Second DRAM 300 receives the clock signal CLK, the second chip select signal CS1, the command signal CMD, the data input/output signal DQ, and the data strobe signal DQS.

Controller 100 includes a first On-Die Termination (ODT) 110 connected to a DQ line 400. In this context, the term "on-die" has reference to one or more element(s) integrated into the semiconductor die of controller 100. First ODT 110 includes a first resistor R0 connected between a power supply voltage terminal VDD and DQ line 400. First resistor R0 is assumed to have a conventionally common resistance of 60Ω.

First DRAM 200 includes a second ODT 210 connected to DQ line 400. Second ODT 210 includes a second resistor R1 and a first switch SW1 connected in series between the power supply voltage terminal VDD and DQ line 400. Second resistor R1 is also assumed to have a resistance of 60Ω. First switch SW1 is turned ON in response to a first ODT signal ODT0. The first ODT signal ODT0 is generated by a write command applied to first DRAM 200.

Second DRAM 300 includes a third ODT 310 connected to DQ line 400. Third ODT 310 includes a third resistor R2 and a second switch SW2 connected in series between the power supply voltage terminal VDD and DQ line 400. Third resistor R2 is assumed to have a resistance of 60Ω. Second switch SW2 is turned ON in response to a second ODT signal ODT1. The second ODT signal ODT1 is generated by a write command applied to second DRAM 300.

FIG. 2 is a timing diagram illustrating the operation of the semiconductor system shown in FIG. 1. Referring to FIG. 2, the clock signal CLK is applied to the semiconductor system. The first chip select signal CS0 and a first write command WR0 supplied to first DRAM 200 are generated in response to a first clock pulse C0 (e.g., in the illustrated example, a first leading or rising clock edge). The second chip select signal CS1 and a second write command WR1 applied to second DRAM 300 are generated in response to a third clock pulse C2. Thereafter, sequential data bursts corresponding to a first data group—FDIN0 through FDIN3, and a second data group—SDIN0 through SDIN3 are generated in response to the rising and falling edges of the data strobe signal DSQ. The first data group FDIN0 through FDIN3 is written to first DRAM 200 and the second data group SDIN0 through SDIN3 is written to second DRAM 300.

The first ODT signal ODT0 is enabled (i.e., logically "high" in the illustrated example) during clock pulses C1, C2, C3 and C4 following the first write command WR0. When the first ODT signal ODT0 is enabled, first switch SW1 of second ODT 210 of first DRAM 200 is turned ON. Accordingly, it is expected that first resistor R0 will impedance match second resistor R1, thereby preventing signal reflections from DQ line 400 during the transmission of the first data group FDIN0 through FDIN3 to first DRAM 200.

The second ODT signal ODT1 is enabled during clocks pulses C3 through C6 following the second write command WR1. When the second ODT signal ODT1 is enabled, second switch SW2 of third ODT 310 of second DRAM 300 is turned ON. Accordingly, it is expected that first resistor R0 will impedance match third resistor R2, thereby preventing signal reflections from DQ line 400 during transmission of the second data group SDIN0 through SDIN3 to second DRAM 300.

However, during the interval in which both the first and second ODT signals ODT0 and ODT1 are enabled, (e.g., clock pulses C3 and C4 in the illustrated example), DQ line 400 is effectively connected by parallel to first and second DRAMs 200 and 300 and corresponding second and third resistors R1 and R2. Thus, during the overlapping transmission intervals and with the foregoing assumptions, DQ line 400 has an impedance of 30Ω. Accordingly, the transmission line impedance of DQ line 400 intended to be matched to the 60Ω first ODT 110 in controller 100 is actually 30Ω. Thus, an impedance mismatch occurs during the transmission overlap interval. Continuing with the illustrated example, the data transmitted during data intervals FDIN2 and FDIN3 within the first data group and data transmitted during the data interval SDIN0 within the second data group can not be considered stable or reliably written to first and second DRAMs 200 and 300 via shared DQ line 400 due to the presence of signal reflections on the line.

SUMMARY OF THE INVENTION

Embodiments of the present invention provide a method of actively controlling the On-Die Termination (ODT) impedances of semiconductor devices connected via transmission lines in a semiconductor system. Embodiments of the invention also provide an ODT control method using mode registers and termination addresses assigned to the various semiconductor devices within a semiconductor system. Embodiments of the invention also provide an ODT control method using write-to-write latency for constituent semiconductor devices connected via transmission lines in a semiconductor system.

In one embodiment, the invention provides a method of controlling On-Die Termination (ODT) resistors implemented in a plurality of memory devices within a semiconductor system, wherein the plurality of memory devices share a signal line, and the method comprises; upon activating one of the plurality of memory devices, setting an ODT resistor connected to the signal line to a first resistance in the activated memory device, and upon activating all memory devices in the plurality of memory devices, setting respective ODT resistors connected to the signal line to a second resistance in the activated memory devices.

In another embodiment, the invention provides a method of controlling On-Die Termination (ODT) resistors in memory devices in a semiconductor system including at least two memory devices sharing a signal line, the method comprising; setting ODT control enable signals applied to the respective memory devices and setting termination information for the signal line within a mode register associated with each one of the memory devices, and controlling the resistance of the ODT resistors connected to the signal line in response to the ODT control enable signals, the termination information, and applied termination address bits by, setting an ODT resistor connected to the signal line to a first resistance in an activated memory device, upon activating only one of the memory devices, and setting respective ODT resistors connected to the signal line to a second resistance in the memory devices upon activating all of the memory devices.

In another embodiment, the invention provides a method of controlling On-Die Termination (ODT) resistors in memory devices within a semiconductor system including at least two memory devices sharing a signal line and connected to a common controller, the method comprising; enabling a first ODT signal to a first memory device in response to a first write command applied to the first memory device from the controller, connecting a first ODT resistor to a first portion of the signal line associated with the first memory device in response to the first ODT signal, enabling a second ODT signal of a second memory device in response to a second write command applied to the second memory device from the controller, and connecting a second ODT resistor to a second portion of the signal line associated with the second memory device in response to the second ODT signal, wherein write-to-write latency exists between the first write command and the second write command.

BRIEF DESCRIPTION OF THE DRAWINGS

FIG. 4 illustrates an exemplary set of ODT resistance settings according to an embodiment of the invention;

DESCRIPTION OF EMBODIMENTS

Figure 1:
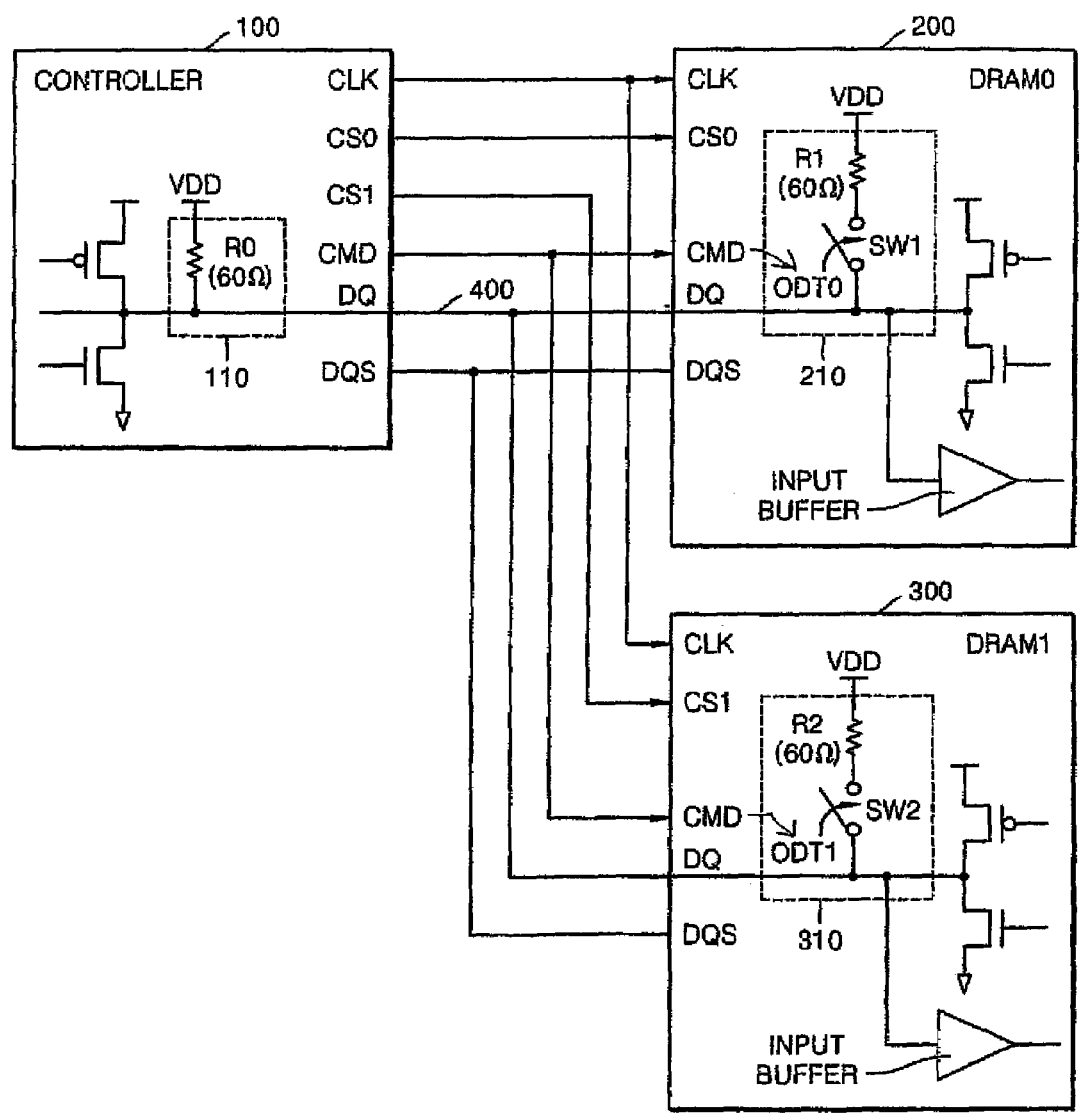
FIG. 1 is a block diagram of a conventional semiconductor system.
Figure 2:
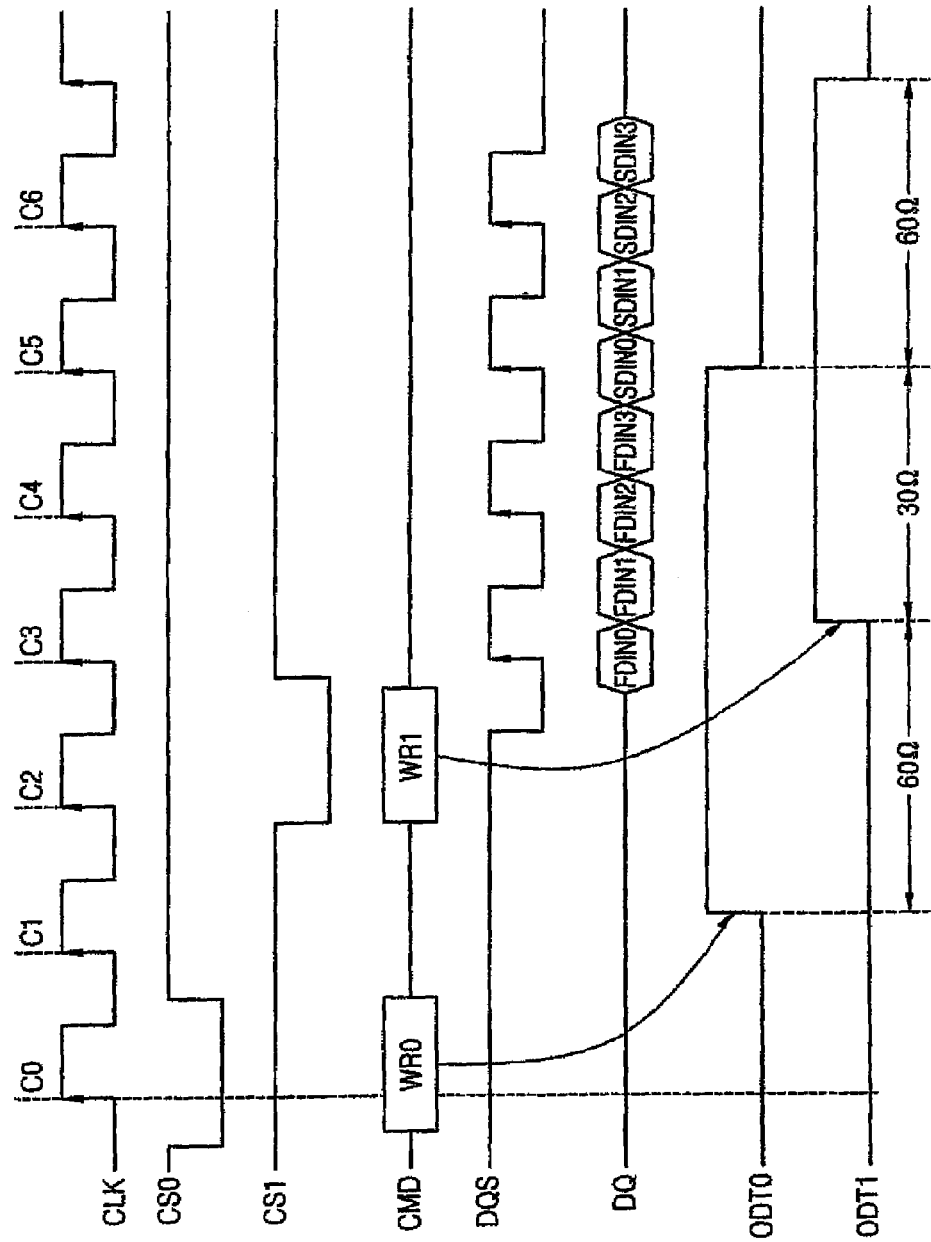
FIG. 2 is a timing diagram illustrating operation of the semiconductor system shown in FIG. 1.

Embodiments of the invention will now be described more fully with reference to the accompanying drawings. The invention may, however, be embodied in many different forms and should not be construed as being limited to only the embodiments set forth herein. Rather, the embodiments are presented as teaching examples. Throughout the drawings and written description, like reference numerals refer to like or similar elements.

Figure 3:
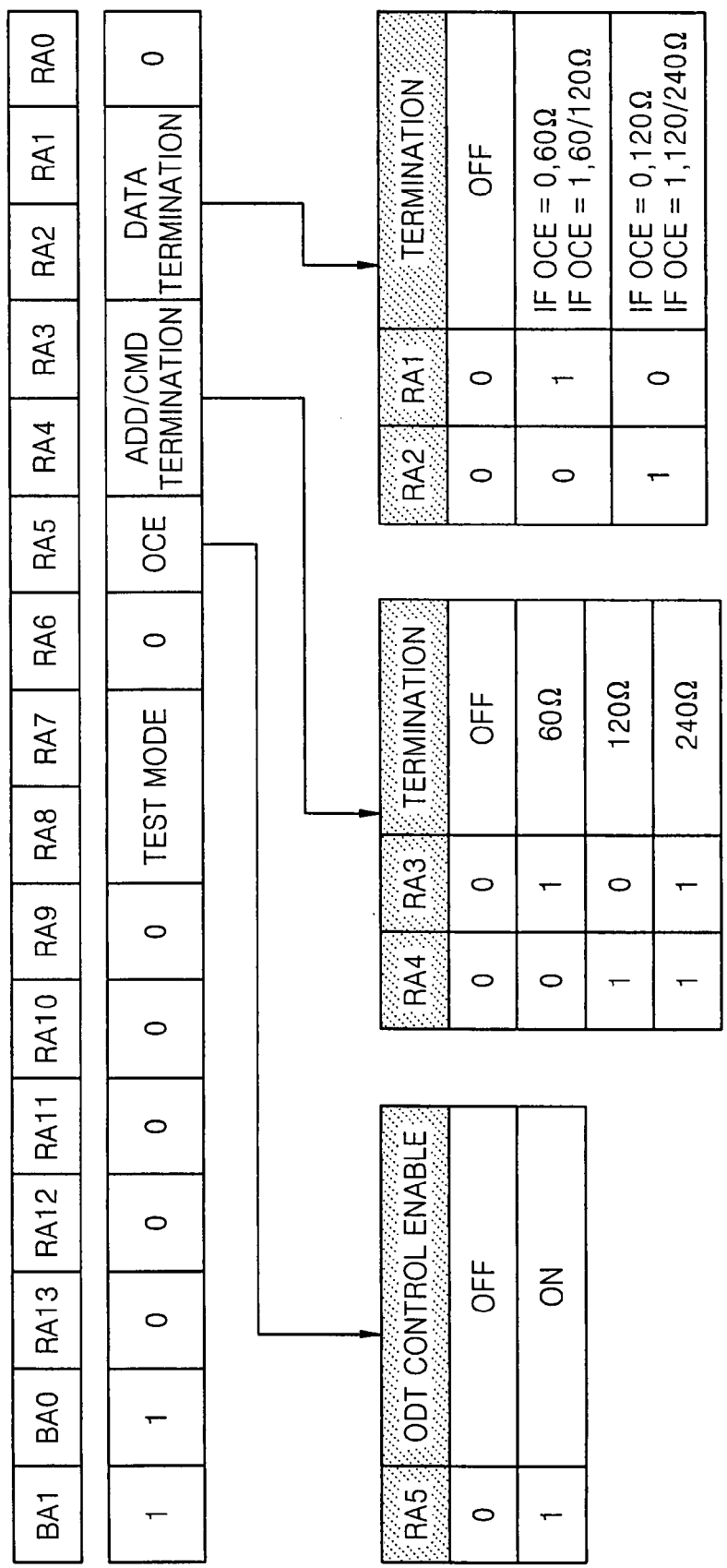
FIG. 3 is a diagram illustrating an extended mode register setting method for an On-Die Termination (ODT) control method according to an embodiment of the invention.

FIG. 3 is a conceptual diagram illustrating an extended mode register setting method for an On-Die Termination (ODT) control method according to an embodiment of the present invention. Referring to FIG. 3, an extended mode register stores data controlling ODT resistors associated with a semiconductor device, such as a memory device. In the illustrated example, it is assumed that address bits RA1 and RA2 are used to define a data termination state, address bits RA3 and RA4 are used to establish an address and/or command termination state, and address bit RA5 is used to indicate whether or not ODT control is enabled.

When address bits RA2 and RA1 are set to "00", data termination is not provided (i.e., set to an OFF state). When address bits RA2 and RA1 are set to "01", data termination is set to 60Ω when an ODT enable signal OCE is logically low (i.e., has a value of "0") and to either 60Ω or 120Ω when the ODT enable signal OCE is high (i.e., has a value of "1"). When the address bits RA2 and RA1 are set to "10", data termination is set to 120Ω when the ODT enable signal OCE is low, and to either 120Ω or 240Ω when the ODT enable signal OCE is high.

When the address bits RA4 and RA3 are set to "00", the address/command termination is not executed. The address/command termination is set to 60Ω when the address bits RA4 and RA3 are set to "01", to 120Ω when the address bits RA4 and RA3 are set to "10", and to 240Ω when the address bits RA4 and RA3 are set to "11".

The ODT control is disabled when the address bit RA5 is low and enabled when the address bit RA5 is high.

FIG. 4 illustrates an ODT resistance setting method according to an embodiment of the present invention. In the illustrated example of FIG. 4, an ODT resistance is set to 60Ω, 120Ω and 240Ω in response to termination address bits TA0, TA1, TA2 and TA3. In one more specific embodiment, the termination address bits TA1, TA2 and TA3 may be obtained from column address bits which are not used during write commands, since the number of column address bits used in contemporary DRAM devices is often smaller than the number of row address bit.

Figure 5:
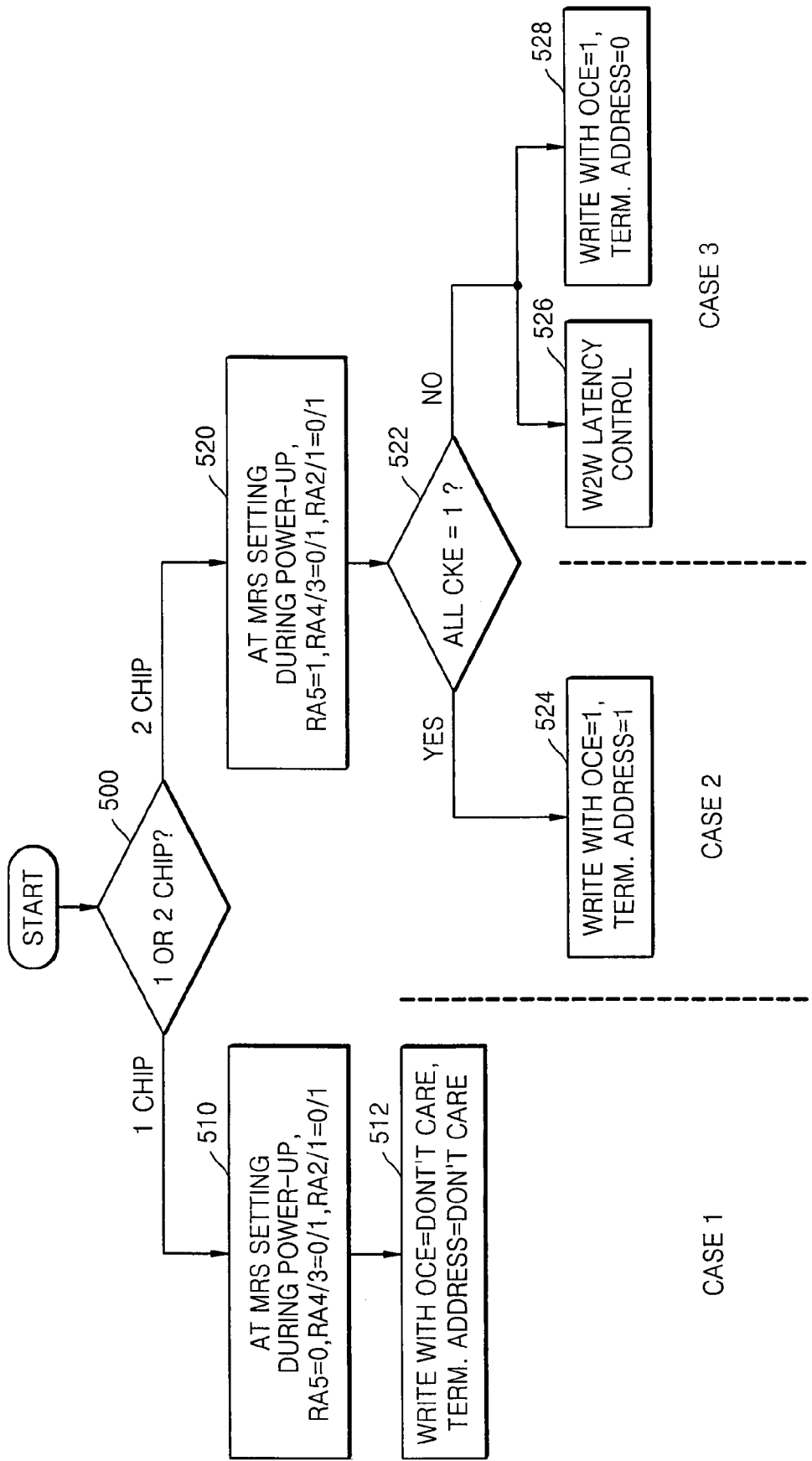
FIG. 5 is a flow chart illustrating an ODT control method according to an embodiment of the invention.

FIG. 5 is a flow chart illustrating an ODT controlling method according to an embodiment of the invention. Referring to FIG. 5, the ODT controlling method may be executed within a semiconductor system, such as the one illustrated in FIG. 1. Naturally, other systems are susceptible to the dictates of the present invention regardless of the actual number of semiconductor (e.g., memory) devices within the system.

For example, if it is initially assumed that the semiconductor system has a single memory device, the extended mode register (MRS) may be set up as illustrated in FIG. 3 during a power-up operation (510) for the system. The ODT properties of the constituent memory device may be controlled by setting address bit RA5 low, address bits R4 and R3 respectively low and high, and address bits RA2 and RA1 respectively low and high. Accordingly, during execution of a subsequent operation (512), the address/command termination of the memory device is set to 60Ω and the data termination is set to 60Ω, irrespective of the ODT control enable signal OCE, the write command, and termination address.

Now, assuming that the semiconductor system has two memory devices, the extended mode register (MRS) is again set-up as illustrated in FIG. 3 during the power-up operation (520). The ODT properties of the two memory devices may be controlled by setting address bit RA5 to high, address bits R4 and R3 respectively to low and high, and address bits RA2 and RA1 respectively to low and high.

Within this operational configuration, the memory devices will operate in either an active mode or a power-down mode in accordance with an applied clock enable signal CKE. When the clock enable signal CKE is high for both memory devices, that is, when it is determined that both memory devices should be in the active mode (522), the address/command termination and data termination are set to 120Ω in accordance with the ODT control enable signal OCE and the termination address TA1 being high when a write command is applied to the semiconductor system (524).

Figure 6:
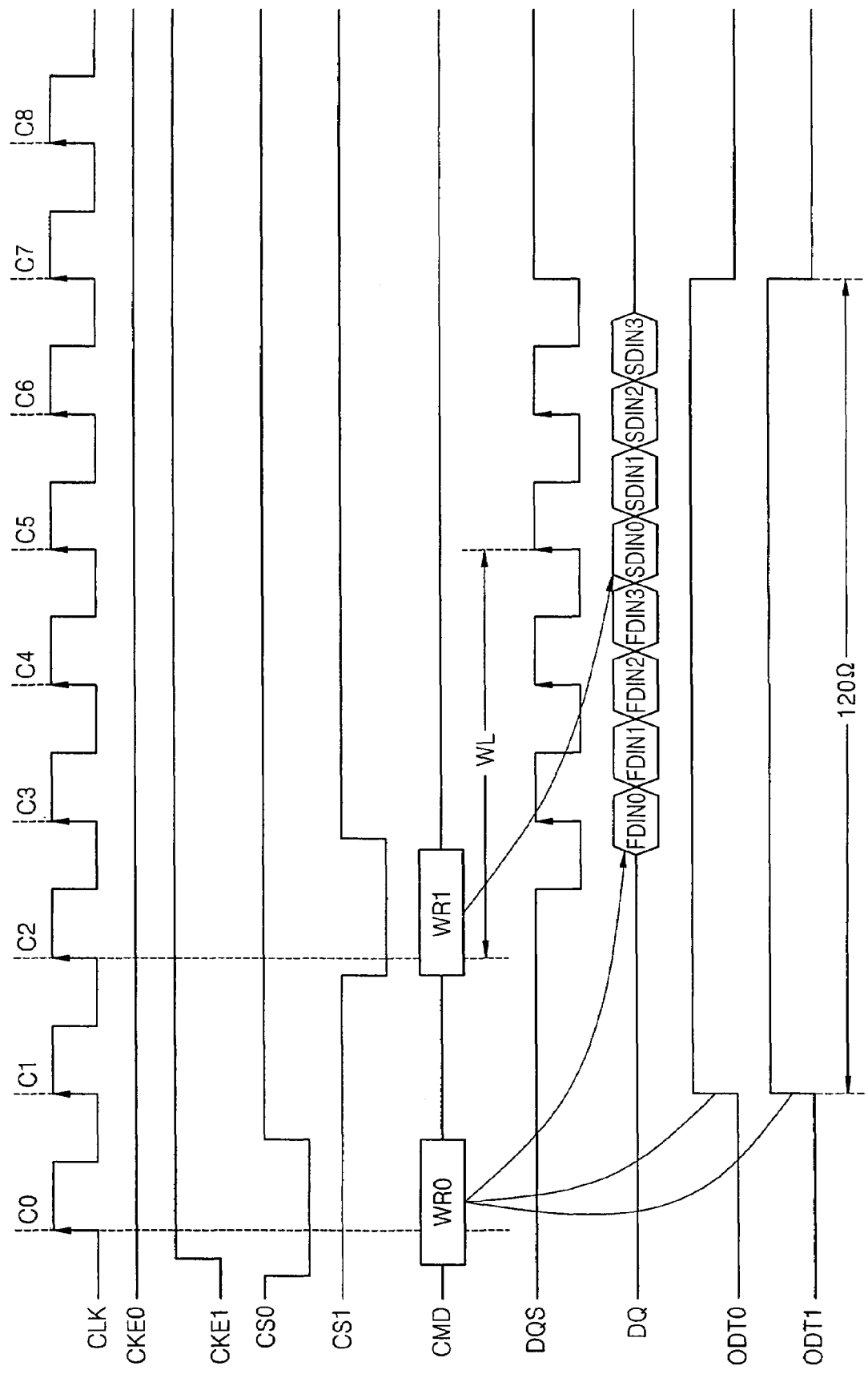
FIG. 6 is a timing diagram illustrating an ODT control method operative when two semiconductor devices are both in an active mode.

During the second operational case (e.g., CASE 2 or step 524), a first clock enable signal CKE0 for first memory device 200 and a second clock enable signal CKE1 for second memory device 300 are enabled, as illustrated in FIG. 6. The first ODT control signal ODT0 and the second ODT control signal ODT1 are enabled in response to a write command WR0 received together with a first chip select signal CS0 and the ODT control enable signal OCE. Here, the ODT resistance of DQ line 400 connecting first and second memory devices 200 and 300 is set to 120Ω according to termination address bit TA1 (not shown).

Accordingly, the resistance of the portion of DQ line 400 connected to first and second DRAMs 200 and 300 becomes 60Ω, because ODT resistances of 120Ω for the first and second DRAMs 200 and 300 are connected in parallel. Thus the resistance R0 of the portion of DQ line 400 connected to controller 100 is impedance-matched by the parallel resistance apparent at the first and second DRAMs 200 and 300. Accordingly, the first data group FDIN0 through FDIN3 and the second data group SDIN0 through SDIN3 transmitted via DQ line 400 are stably written to first and second DRAMs 200 and 300 without potential interference by undesired signal reflections.

The first and second ODT control signals ODT0 and ODT1 are disabled after a clock cycle corresponding to half the defined burst length BL following write latency WL corresponding to a write command WR1 that is received together with a second chip select signal CS1.

Referring back to FIG. 5, when only the clock enable signal CKE for one of the two memory devices is enabled to "1" (522), that is, when one of the two memory devices is in active mode and the other is in power-down mode, the semiconductor system controls write-to-write latency (526). Alternatively, the semiconductor system sets the address/command termination and data termination to 60Ω according to a high ODT control enable signal OCE and a low termination address bit TA0 when a write command is applied to the semiconductor system.

Figure 7:
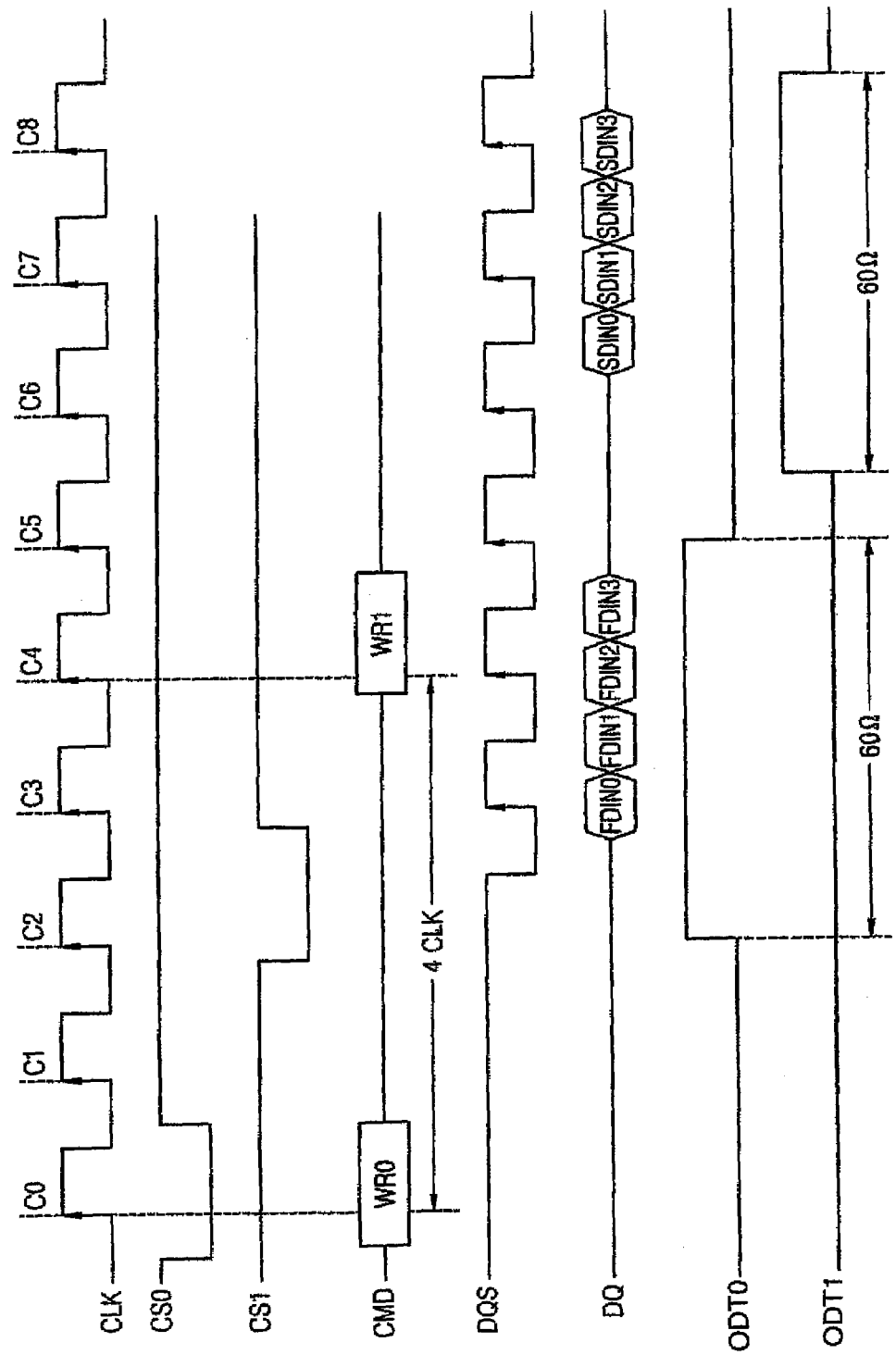
FIG. 7 is a timing diagram illustrating a method of controlling write-to-write latency consistent with the method shown in FIG. 5.

FIG. 7 is a timing diagram further illustrating an operating state (CASE 3 and 526) controlling write-to-write latency as illustrated in FIG. 5. Referring to FIG. 7, the second write command WR1 is applied following at least four clock pulses from the clock signal pulse C0 at which the first write command WR0 is applied (e.g., at clock signal pulse C4) in order to avoid an interval during which the first and second ODT signals ODT0 and ODT1 are simultaneously enabled. Accordingly, the enabled period for the first ODT signal ODT0 according to the first write command WR0 does not overlap the enabled period for the second ODT signal ODT1 according to the second write command WR1. During the enabled period for the first ODT signal ODT0, the first data group FDIN0 through FDIN3 is transmitted via DQ line 400 to first DRAM 200 without signal reflections. During the enabled period of the second ODT signal ODT1, the second data group SDIN0 through SDIN3 is transmitted via through DQ line 400 to second DRAM 300 without signal reflections.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. A method of controlling On-Die Termination (ODT) resistors implemented in a plurality of memory devices within a semiconductor system, wherein the plurality of memory devices share a signal line, the method comprising:
   upon activating one memory device of the plurality of memory devices, setting an ODT resistor connected to the signal line to a first resistance in the activated memory device in response to termination information; and
   upon activating more than one memory devices of the plurality of memory devices, setting respective ODT resistors connected to the signal line to a second resistance in the activated memory devices in response to the termination information;
   wherein the termination information is set within a mode register associated with each one of the memory devices.

2. The method of claim 1, wherein the first resistance and the second resistance are determined by column address bits which are unused during a write command applied to one or more memory devices in the plurality of memory devices.

3. The method of claim 1, wherein the first resistance and the second resistance are determined by column address bits which are unused during a read command applied to one or more memory devices in the plurality of memory devices.

4. The method of claim 1, wherein the second resistance is approximately half the first resistance.

5. The method of claim 1, wherein the signal line is at least one of an address line, command line or data line.

6. A method of controlling On-Die Termination (ODT) resistors in memory devices in a semiconductor system including at least two memory devices sharing a signal line, the method comprising:
   setting ODT control enable signals applied to the respective memory devices and termination information for the signal line within a mode register associated with each one of the memory devices; and
   controlling resistances of the ODT resistors connected to the signal line in response to the ODT control enable signals, the termination information, and applied termination address bits, wherein controlling the resistances comprises:
      setting an ODT resistor connected to the signal line to a first resistance in an activated memory device, upon activating only one of the memory devices; and
      setting respective ODT resistors connected to the signal line to a second resistance in the memory devices upon activating more than one of the memory devices.

7. The method of claim 6, further comprising:
   setting address/command termination information for the memory devices within the mode register.

8. The method of claim 6, wherein the termination address bits are column address bits which are unused during read or write commands applied to the memory devices.

9. The method of claim 6, wherein the second resistance is approximately half the first resistance.

10. The method of claim 6, wherein the signal line is an address line, command line or data line.

11. A method of controlling On-Die Termination (ODT) resistors in memory devices within a semiconductor system including at least two memory devices sharing a signal line and connected to a common controller, the method comprising:

enabling a first ODT signal to a first memory device in response to a first write command applied to the first memory device from the controller;

connecting a first ODT resistor to a first portion of the signal line associated with the first memory device in response to the first ODT signal;

enabling a second ODT signal of a second memory device in response to a second write command applied to the second memory device from the controller; and connecting a second ODT resistor to a second portion of the signal line associated with the second memory device in response to the second ODT signal, wherein write-to-write latency exists between the first write command and the second write command.

12. The method of claim 11, wherein the first ODT resistor and the second ODT resistor have the same resistance.

13. The method of claim 11, wherein the write-to-write latency is set such that an enabled period of the first ODT signal does not overlap an enabled period of the second ODT signal.

14. The method of claim 11, wherein the signal line is an address line, command line or data line.

* * * * *